United States Patent [19]

Killingsworth

[11] Patent Number: 4,511,798

[45] Date of Patent: Apr. 16, 1985

[54] METER ENCODING REGISTER WITH TAPERED APERTURE IN BAFFLE INSERT

[75] Inventor: Emmett D. Killingsworth, Raleigh, N.C.

[73] Assignee: Westinghouse Electric Corp., Pittsburgh, Pa.

[21] Appl. No.: 469,070

[22] Filed: Feb. 23, 1983

[51] Int. Cl.³ .................. G01D 5/38; G08C 19/16
[52] U.S. Cl. .................. 250/231 SE; 250/237 G; 340/870.29; 340/347 P
[58] Field of Search ........ 250/231 SE, 237 G, 237 R; 324/96; 340/347 P, 870.02, 870.28, 870.29; 356/375, 395

[56] References Cited

U.S. PATENT DOCUMENTS

| | | | |
|---|---|---|---|
| 3,058,001 | 10/1962 | Dertouzos | 250/231 SE |
| 4,037,219 | 7/1977 | Lewis | 250/231 SE |
| 4,221,963 | 9/1980 | Fushimi | 250/231 SE |
| 4,342,908 | 8/1982 | Henningsen et al. | 250/231 SE |
| 4,375,592 | 3/1983 | Cox et al. | 250/231 SE |

Primary Examiner—Edward P. Westin
Attorney, Agent, or Firm—L. P. Johns

[57] ABSTRACT

A multiple shaft meter including register characterized by an electrical signal generating system including illuminating source and a plurality of encoding photocells. A light baffle plate is disposed between the illumination source in the photocells and is provided with apertures aligned with respective photocells, and the apertures being tapered to minimize stray light effects.

4 Claims, 4 Drawing Figures

METER ENCODING REGISTER WITH TAPERED APERTURE IN BAFFLE INSERT

BACKGROUND OF THE INVENTION

1. Field of the Invention

This invention relates to a meter encoding register having tapered apertures in a baffle insert.

2. Description of the Prior Art

The encoding of meter readings for use in remote reading telemetry systems is well known. In a utility meter, registers provide a readout of the total consumption of the measured quantity, such as kilowatt-hours of electrical energy in a watthour meter, by converting the sum of rotations of a meter shaft into calibrated dial readings. Watthour meter registers are typically provided with four or five dials each having an associated pointer shaft which are driven by a gear train system from the rotating meter movement. The five dials, for example, have readings in units, tens, hundreds, thousands, and ten thousands of the quantity to be measured, for example, kilowatt-hours. The register has a predetermined ratio constant which is related to the consumption of the quantity to be measured and the rate of rotation of the metering movement produced by the consumption of one unit of the quantity to be measured. In an encoding register, the angular position of each of the dial pointer shafts is converted, or encoded, into an electrical binary or digital signal. In remote utility meter reading systems, encoding at the meter permits the electrical signal representation to be compared to the register dial reading at the meter site.

In U.S. Pat. No. 4,037,219 issued July 19, 1977 to Arthur Lewis and assigned to the assignee of this invention, there is disclosed and claimed an optoelectronic meter register encoder wherein a notched pattern disk, or code wheel, is mounted to each of a plurality of pointer shafts. The code wheels actuate photosensitive pickups, or photocells, to produce a multiplebit binary code representation of the angular position of each pointer shaft. In accordance with the known construction of meter registers, the pointer shafts are interconnected by gearing so as to have a predetermined ratio such as a ratio of 1 to 10. In a five-dial decade register, the units dial will rotate 10,000 times for a 1/10 incremental rotation of the ten-thousands dial. The thousands, hundreds, and tens dials will be proportionally rotated along with the movement of the lowest and highest order dials.

In photoconductive encoding registers of prior construction there has been a problem of obtaining a 9° switching (on to off) of a photocell. This 9° switching must be maintained to get an accurate reading. One difficulty has been enabling enough light to reach the cell to activate it. More particularly, a hole through which the light passes had to be so large that a light blocking code wheel made much more than a 9° turn before blocking out the light and turning the photocell off.

SUMMARY OF THE INVENTION

In accordance with this invention a multiple shaft meter encoding register for utility meters is provided having a metering movement responsive to a metered quantity, and including a plurality of rotatable shafts, means for interconnecting the shafts with an associated metering movement for concurrently rotating the shafts at different predetermined rates in response to actuation by the associated metering movement, means for generating electric signals responsive to the position of the shafts and including a plurality of code members each fixedly mounted to a separate one of the shafts, an illumination source and a plurality of encoding photocells, each of the code members alternately transmitting and blocking illumination between the illumination source and the photocells in response to rotation of the shafts, baffle means between the illumination source and the photocells for isolating light rays from the source and for avoiding ambient illumination, and the baffle means including tapered apertures aligned with corresponding photocells, each aperture having a smaller end nearer the illumination source and a larger end near the photocell.

An advantage of the device of this invention is that it allows for a narrow switch angle from active to non-active state of a photocell, but providing a tapered aperture in a baffle insert for an encoding register. Moreover, the device not only allows a 9° switch, but eliminates the need for a light shield.

DESCRIPTION OF THE PREFERRED EMBODIMENTS

Figure 1:
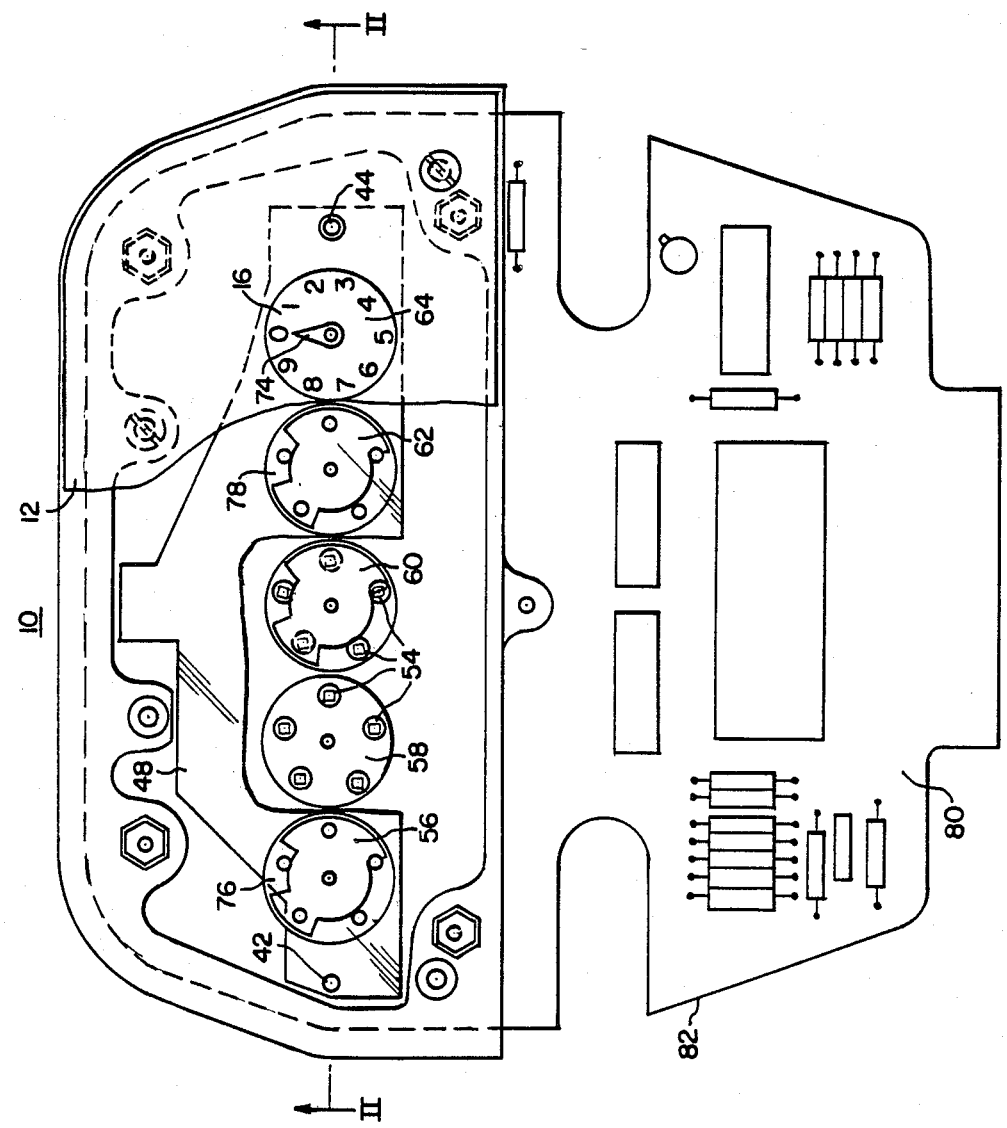
FIG. 1 is a front plan view with parts broken away of a meter encoding register assembly made in accordance with the present invention.

A reader encoding register, generally indicated at 10 (FIG. 1), is an optoelectronic device substantially disclosed in the aforementioned U.S. Pat. No. 4,037,219, with the additional improvements of the invention as disclosed herein. The register 10 generally includes a front dial plate 12 having five decade-related dials, of which the units dial 16 is shown at the right hand side of the dial plate 12. The dials indicate numerical meter readings of measured kilowatt-hours produced by the metering movement of the watthour meter. The movement is well known in the art and may be, for example, of the general type disclosed in the aforementioned U.S. patent. The metering movement, not shown, typically includes a shaft coupled to the register 10 and a disk electromagnetically driven by magnetic fluxes produced by voltage and current through the circuit being monitored. The metering movement applies rotational input to the register assembly 10 through the input gear 18, shown in FIG. 2. Circularly disposed numerals "0" through "9" define each of the dials on the dial plate 12. The dials are progressively ascending in the clockwise direction on alternate dials, beginning with the right-hand units dial. The two remaining dials are progressively ascending in a counterclockwise direction, as described in the aforementioned U.S. Pat. No. 4,037,219. The register assembly 10 (FIGS. 1, 2) includes a support structure, or frame, comprising a backplate 20 and an encoder assembly 22 joined by support posts 24, 26, 28, and 30.

The register assembly 10 also includes five pointer shafts 32, 34, 36, 38, and 40 which extend through the encoder assembly 22 and are journaled into the backplate 20 and a dial plate 12. The pointer shafts 32–40 extend in parallel relationship to each other and are oriented so as to extend through the center axis of each of five register dials, one of which 16 is shown in FIG. 1. The shafts 32-40 are interconnected by a train of gears 17 which, when driven through the input gear 18 by the metering movement produce simultaneous rotation of the five pointer shafts 32-40 in a decade relationship. As can be seen in the Figures, locating pins 42 and 44 are mounted in the encoder assembly 22 to accurately position the dial plate 12 and a reference alignment member, to be more completely described hereinafter. The gear train is well known in the art and is described, for example, in the aforementioned U.S. patent.

Figure 2:
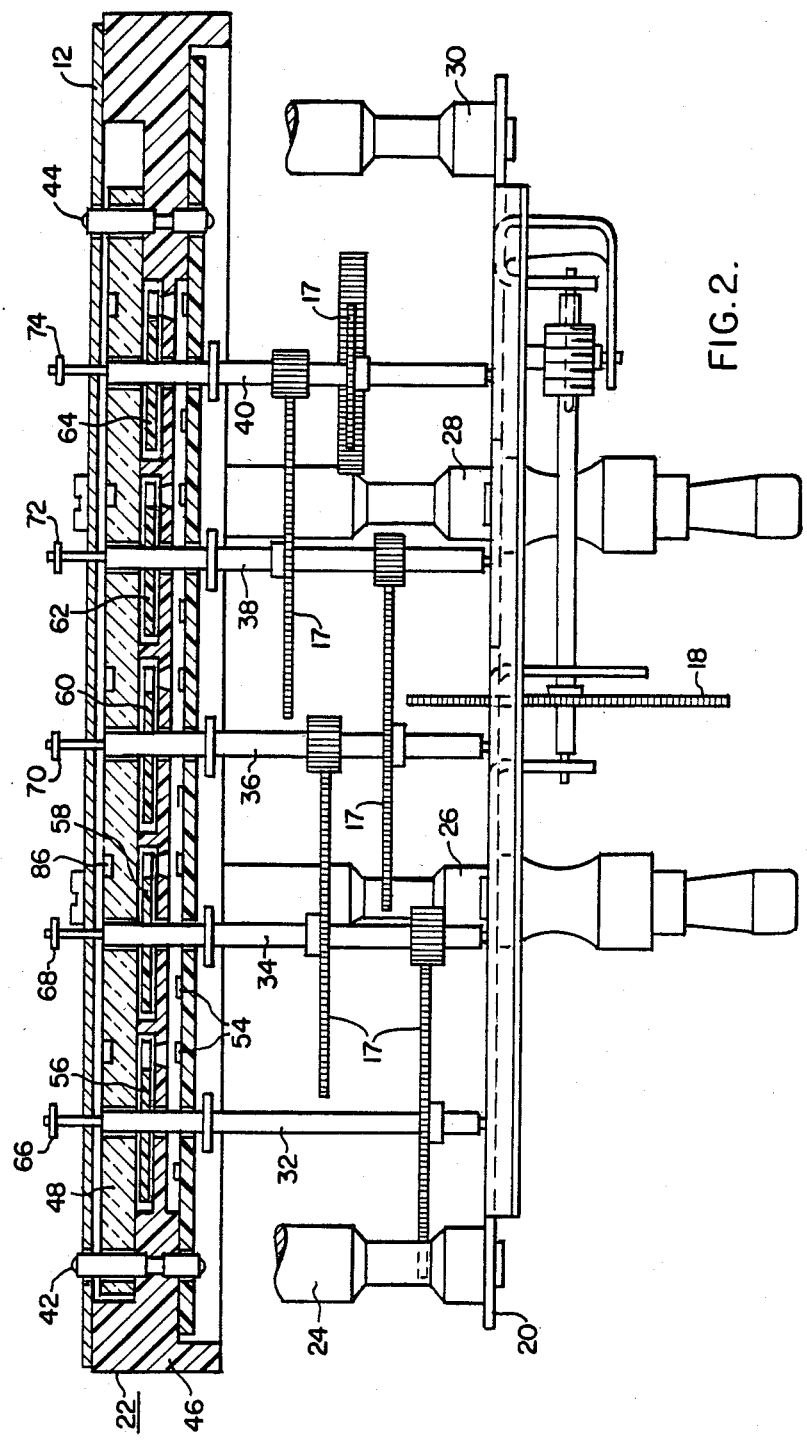
FIG. 2 is a bottom plan view, partially in section, of the register assembly shown in FIG. 1.
Figure 3:
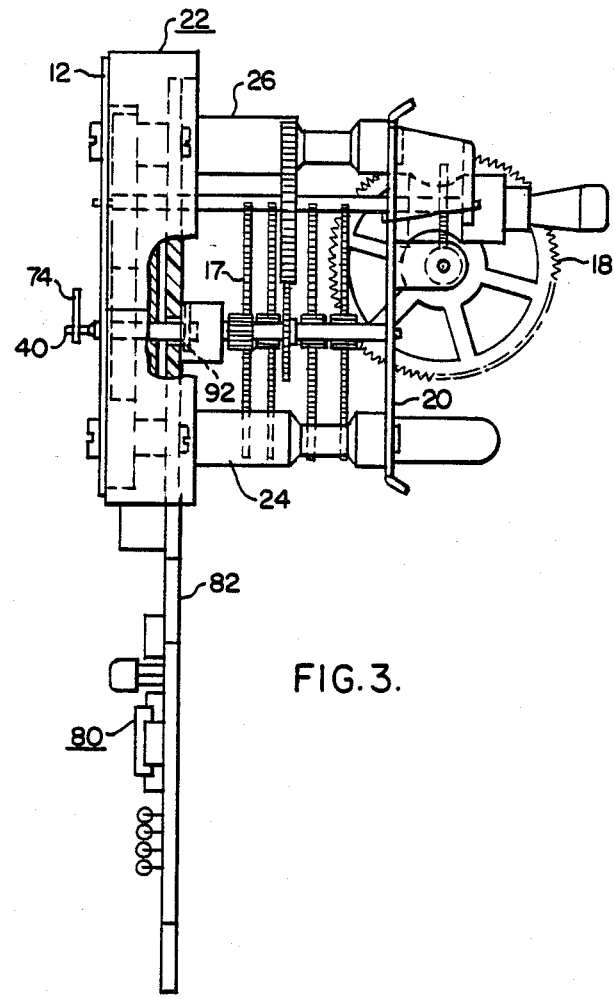
FIG. 3 is a right-side plan view of the register assembly shown in FIGS. 1 and 2.

The encoder assembly 22, described more completely in U.S. Pat. No. 4,342,908 includes a frame member 46 (FIG. 2) through which extend the five pointer shafts 32-40. Directly behind the dial plate 12 is a light plate 48 of transparent plastic material which distributes light from a light source 50 to provide a plurality of parallel illumination sources shining in a direction perpendicular to the plane of light plate 48 and dial plate 12. A photocell array is provided which includes five circular groups of photosensitive components or photocells 54 concentrically disposed around each of the pointer shafts 32-40. Interposed between the photocells 54 and the light plate 48 are five code members, or wheels, 56, 58, 60, 62, 64, each of which is fixedly attached to a corresponding pointer shaft 32-40. The code wheels 56-64 are disposed in fixed angular relationship to the shafts 32-40 and corresponding dial pointers 66, 68, 70, 72, and 74. The code wheels (FIG. 1) have cut-out portions 76 and 78 such that rotation of the pointer shafts is operable to rotate the respective code wheels and alternately transmit and block light rays from the light plate 48 to the photocells 54. As can be seen in FIGS. 1 and 2, the code wheels and photocells are effectively baffled by the frame member 46 to provide efficient operation of the encoder with relatively low levels of illumination from the source 50 and prevent interference from ambient illumination.

In a manner more completely described in the aforementioned U.S. Pat. No. 4,037,219, rotation of the pointer shafts to produce alternate conditions of illumination and darkness upon the photocells is operable to provide electrical signals indicative of the angular position of the pointer shafts 32-40. These signals are detected by electronic circuitry 80 mounted upon a printed circuit board 82 directly behind the photocell array 52. The circuitry 80 interprets the changing electrical signals from the photocells 54 to produce a coded signal representative of the angular positions of the shafts, which in turn provides an electronic signal coded with the amount of electrical energy consumed by the circuit connected to the associated metering movement. The output of the electronic circuitry is thus directly representative of the reading produced by the dial pointers 66-74.

In registers using the code system disclosed in the aforementioned U.S. Pat. No. 4,037,219, which have five photocells spaced in equiangular positions around each of the shafts 32-40, the electrical reading produced by each group of five photocells will change upon a shaft rotation of 18 degrees. However, proper interdial alignment required less than 9 degrees alignment error. The procedure used for interdial alignment called for the operator to set the dial to a transition point between two electrical readings such that gear backlash in the register would allow the reading to oscillate between the two electrical readings on either side of the transition point. Since gear backlash was generally less than a few degrees, this procedure permitted alignment well within the 9 degree maximum allowable error.

Figure 4:
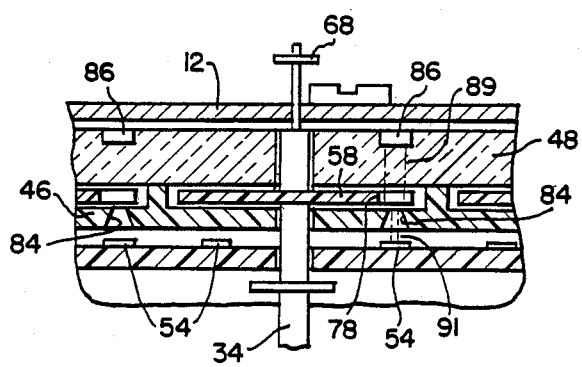
FIG. 4 is an enlarged view of a portion of FIG. 2.

In accordance with this invention, the frame 46 (FIG. 4) includes a plurality of apertures 84 (FIG. 4), one aperture for each photocell 54. One aperture is disposed between each photocell and a corresponding coupler or reflector 86 in the light plate 48. Each aperture 84 has tapered walls between opposite sides of the frame 46. The smaller end of each aperture is nearer the illumination source 86, and the larger end is nearer the photocell 54.

Accordingly, when a code member 58 is disposed in such a position that one of the cutout portions 76, 78 is aligned with the aperture 84, a ray of light 89 (FIG. 4) reflected from the coupler or reflector 86 passes through the cutout portion 78 in the aperture 84 to the photocell 54. The smaller ends of the aperture 84 are slightly smaller than the light ray 89 reflected from the coupler 86 so that a ray of light 91 of reduced thickness is transmitted from the smaller end to the photocell 54, whereby any scattered or dispersed light rays are blocked out by the surface of the frame, resulting in a smaller wave passing through the aperture 84 to the photocell 54.

Although the tapered aperture 84 is shown as being conical, with straight sides extending from the smaller to the larger end of the aperture, it is understood that any other surface than conical may be used, such as arcuate or spherical. Thus, the frame 46 functions as a baffle and the tapered aperture allows sufficient light to reach the photocell to activate it while obtaining a 9° switch from on to off status. A further benefit of the tapered aperture is that it reduces stray light effects and eliminates the need for a light shield.

In conclusion, the device of this invention enables a narrow switch angle from active to non-active state of the photocell, reduces light leakage between cells, eliminates need for a light shield, and is readily incorporated into existing encoding registers.

What is claimed is:

1. A multiple shaft meter encoding register for a utility meter having a metering movement responsive to a metering quantity, comprising:

a frame;

a plurality of shafts rotatably mounted in the frame;

means for interconnecting the shafts with an associated metering movement for concurrently rotating the shafts at different predetermined rates in response to actuation by the associated metering movement;

means for generating electrical signals responsive to the position of the shafts and including a plurality of code members each fixedly mounted to a separate one of the shafts;

the electrical signal generating means comprising an illumination source and a plurality of encoding photosensitive components, each of the code members alternately transmitting and blocking illumination between the illumination source and the photosensitive components in response to rotation of the shafts;

baffle means between the illumination source and the photosensitive components for isolating light rays from the source and for avoiding ambient illumination, and the baffle means including tapered apertures aligned with corresponding photosensitive components, each aperture having a smaller end nearer the illumination source and a larger end nearer the photosensitive component.

2. The device of claim 1 in which the baffle means is an opaque plate with said apertures disposed around the axes of the shafts, each aperture being aligned with a corresponding photosensitive component.

3. The device of claim 2 in which the opaque plate has opposite side walls with a smaller end of the aperture being on the side of the plate nearer the illumination source.

4. The device of claim 3 in which the tapered apertures are conical.

* * * * *